(12) United States Patent
Arthur et al.

(10) Patent No.: US 6,988,925 B2
(45) Date of Patent: Jan. 24, 2006

(54) METHOD FOR PATTERNING CARBON NANOTUBE COATING AND CARBON NANOTUBE WIRING

(75) Inventors: David J. Arthur, Norwood, MA (US); Paul J. Glatkowski, Littleton, MA (US)

(73) Assignee: Eikos, Inc., Franklin, MA (US)

( * ) Notice: Subject to any disclaimer, the term of this patent is extended or adjusted under 35 U.S.C. 154(b) by 0 days.

(21) Appl. No.: 10/442,176

(22) Filed: May 21, 2003

(65) Prior Publication Data

US 2004/0099438 A1    May 27, 2004

Related U.S. Application Data

(60) Provisional application No. 60/381,809, filed on May 21, 2002, provisional application No. 60/381,810, filed on May 21, 2002.

(51) Int. Cl.
*H01J 9/04* (2006.01)
*H01J 9/12* (2006.01)
*H01J 9/14* (2006.01)

(52) U.S. Cl. ............................. 445/46; 427/77; 427/197

(58) Field of Classification Search ............ 313/346 R, 313/309, 310, 336, 351; 445/46, 49, 51; 427/77, 197
See application file for complete search history.

(56) References Cited

U.S. PATENT DOCUMENTS

| | | | |
|---|---|---|---|
| 5,916,642 A | 6/1999 | Chang | 29/509 |
| 6,278,231 B1 | 8/2001 | Iwasaki et al. | 313/310 |
| 6,630,772 B1 | 10/2003 | Bower et al. | 313/311 |
| 2003/0178927 A1 * | 9/2003 | Han et al. | 313/346 R |

OTHER PUBLICATIONS

Liu, Jie, et al., "Controlled Deposition of Individual Single-Walled Carbon Nanotubes on Chemically Functionalized Templates," *Chemical Physics Letters*, 303:125-129 (1999).

* cited by examiner

*Primary Examiner*—Joseph Williams
*Assistant Examiner*—Kevin Quarterman
(74) *Attorney, Agent, or Firm*—Powell Goldstein LLP

(57) ABSTRACT

A method for making a nanocomposite electrode or circuit pattern includes forming a continuous carbon nanotube layer impregnated with a binder and patterning the binder resin using various printing or photo imaging techniques. An alternative method includes patterning the carbon nanotube layer using various printing or imaging techniques and subsequently applying a continuous coating of binder resin to the patterned carbon nanotube layer. Articles made from these patterned nanocomposite coatings include transparent electrodes and circuits for flat panel displays, photovoltaics, touch screens, electroluminescent lamps, and EMI shielding.

30 Claims, 4 Drawing Sheets

METHOD FOR PATTERNING CARBON NANOTUBE COATING AND CARBON NANOTUBE WIRING

REFERENCE TO RELATED APPLICATIONS

This invention claims priority to U.S. Provisional Application No. 60/381,809 entitled NT Mixtures, and U.S. Provisional Application No 60/381,810 entitled Patterning NT-Based Coatings, both of which were filed on May 21, 2002.

BACKGROUND

1. Filed of the Invention

This invention is directed to methods for patterning carbon nanotube coatings and carbon nanotube wiring made by the methods.

2. Description of the Background

Current electronic devices, including semiconductor-based devices as well as wiring circuits of larger scale, rely on conventional wiring technologies that use metal wiring lines or high impurity regions formed in a semiconductor substrate. Semiconductor-based devices have metal wiring layers that are formed on the semiconductor substrate and interconnect device elements formed on the surface of the semiconductor substrate. The metal layers themselves are often interconnected by via holes piercing through insulating layers separating the metal layers. In addition, portions of the semiconductor substrate that are doped with impurities function as wiring lines within the elements formed on the surface of the semiconductor or between these elements.

Although these wiring lines are made extremely fine using modem photolithographic technologies and, thus, the semiconductor-based devices are made compact, the manufacturing processes of such wiring lines require film forming and manipulating techniques that are operable only in high vacuum. For example, metals such as aluminum and copper are formed on the semiconductor substrate using physical vapor deposition techniques including sputtering and evaporation. Impurity ions such as boron and phosphorus are injected into the semiconductor substrate using ion implantation techniques to form conducting portions in the substrate. Amorphous silicon layers are formed on the substrate by chemical vapor deposition techniques and later transformed into polysilicon by annealing to form a wiring layer. Many of the layers and films formed as above must be patterned to a predetermined wiring pattern by etching process such as reactive ion etching. The level of vacuum may vary depending on the methods, for example $10^{-6}$ torr (sputtering) to a few torr (reactive ion etching). Whatever the vacuum level is, the installation and maintenance of such instruments are expensive. Furthermore, all of the wiring lines formed by above methods do not transmit light well with an exception of those made of inorganic electrode materials such as indium tin oxide (ITO). Extremely thin metal films may be translucent, but stacking of such films results in forming of a layer that practically blocks light. A transparent ITO film may be formed relying on the high level vacuum instruments, but is not flexible due to its inorganic nature. Furthermore, the supply of indium is limited.

Wiring circuits of larger scale are fabricated using methods that do not require expensive installation or maintenance of manufacturing instruments. Print circuit boards are fabricated by etching copper clad laminates coupled with print techniques. These print boards may be rigid when the board is based on epoxy/glass laminates, and may be flexible when it is based on polyimide laminates. Similar structures are made by printing conductive pasts directly on a substrate. The conductive ingredients of the pasts are typically metal fillers such as silver. The conductive pasts are printed on the substrate using screen printing technique or the like. When performance requirements of wiring circuits are very low, the pastes may be applied by a brush.

Though these fabrication methods are inexpensive, it is not possible to make compact device, such as a semiconductor device, relying on these methods. Furthermore, the wiring lines made by these methods are not transparent. Light is blocked by copper clad in the laminate structure and the silver paste applied on a substrate. Accordingly, the wiring structures made by these methods are not applicable to devices that require fine patterning of transparent conductive film, such as electroluminescent display device and liquid crystal display device.

Efforts have been made to provide transparent electrodes to replace ITO film. A typical example is a suspension of ITO particles in a polymer binder. However, this ITO filled system cannot match the electrical conductivity of a continuous ITO film. Furthermore, transparent conductive polymer materials are now being developed. These polymers typically require dopants to impart conductive properties, and are applied on a substrate using screen printing or ink jet application technique. Although they are still at a development stage and yet to reach the conduction level of a ITO film, the presence of dopants is expected to have an adverse effect on controlling the conductive properties, and may not be compatible with device miniaturization.

Films made of carbon nanotubes are known to have surface resistances as low as $10^2$ ohms/square. U.S. Pat. No. 5,853,877, entitled "Method for Disentangling Hollow Carbon Microfibers, Electrically Conductive Transparent Carbon Microfibers Aggregation Film and Coating for Forming Such Film," describes formation of such conductive carbon nanotube films, and U.S. Pat. No. 6,221,330, entitled "Processing for Producing Single Wall Nanotubes Using Unsupported Metal Catalysts," generally describes production of such carbon nanotubes used for forming the conductive films. However, there have been no report in the art on a method for patterning the film made of carbon nanotubes.

Coatings comprising carbon nanotubes such as carbon nanotube-containing films have been previously described (see U.S. patent application Ser. No. 10/105,623, which is incorporated herein by reference). For example, such films may have a surface resistance as low as $10^2$ ohms/square and a total light transmittance as high as 95%. The content of the carbon nanotubes in the film may be as high as 50%.

It has been surprisingly discovered that such materials can be formed by a two step method, which results in carbon nanotube film that have a low electrical resistance as well as a high light transmittance. First, a dilute water solution of carbon nanotubes is sprayed on a substrate, and water is evaporated leaving only the consolidated carbon nanotubes on the surface. Then, a resin is applied on the consolidated carbon nanotubes and penetrates into the network of the consolidated carbon nanotubes.

SUMMARY

This invention overcomes the problems and disadvantages associated with current metal-based and silicon-based wiring technologies and provides new wiring methods that utilize carbon nanotube film to form a wiring line and an electrode.

One embodiment of the invention is directed to a carbon nanotube wiring that includes a substrate and a patterned wiring line or electrode disposed on the substrate and having carbon nanotubes.

Another embodiment of the invention is directed to a method for patterning a carbon nanotube coating. The method includes providing a solution of carbon nanotubes, applying the solution to a substrate to form a film of consolidated carbon nanotubes on the substrate, impregnating the carbon nanotube film selectively with a binder, and removing a part of the carbon nanotube film that is not impregnated with the binder from the substrate.

Another embodiment of the invention is directed to a method for patterning a carbon nanotube coating. The method includes providing a solution of carbon nanotubes, applying the solution to a substrate to form a film of consolidated carbon nanotubes on the substrate, impregnating the carbon nanotube film with a photoresist, projecting a predetermined pattern onto the carbon nanotube film impregnated with the photoresist to secure a part of the carbon nanotube film, and removing a part of the carbon nanotube film that is not secured by the projection from the substrate.

Another embodiment of the invention is directed to a method for patterning a carbon nanotube coating. The method includes providing a solution of carbon nanotubes, applying the solution to a substrate to form a film of consolidated carbon nanotubes on the substrate, exposing the carbon nanotube film to a light source through a mask, and impregnating the exposed carbon nanotube film with a binder.

Another embodiment of the invention is directed to a method for patterning a carbon nanotube coating. The method includes providing a coating mixture having carbon nanotubes and a solvent, applying the coating mixture on a substrate to form a predetermined pattern, removing the solvent from the coating mixture printed on the substrate to leave a patterned film of consolidated carbon nanotubes on the substrate, and impregnating the carbon nanotube film with a binder.

Other embodiments and advantages of the invention are set forth in part in the description, which follows, and in part, may be obvious from this description, or may be learned from the practice of the invention.

DESCRIPTION OF THE INVENTION

Figure 1:
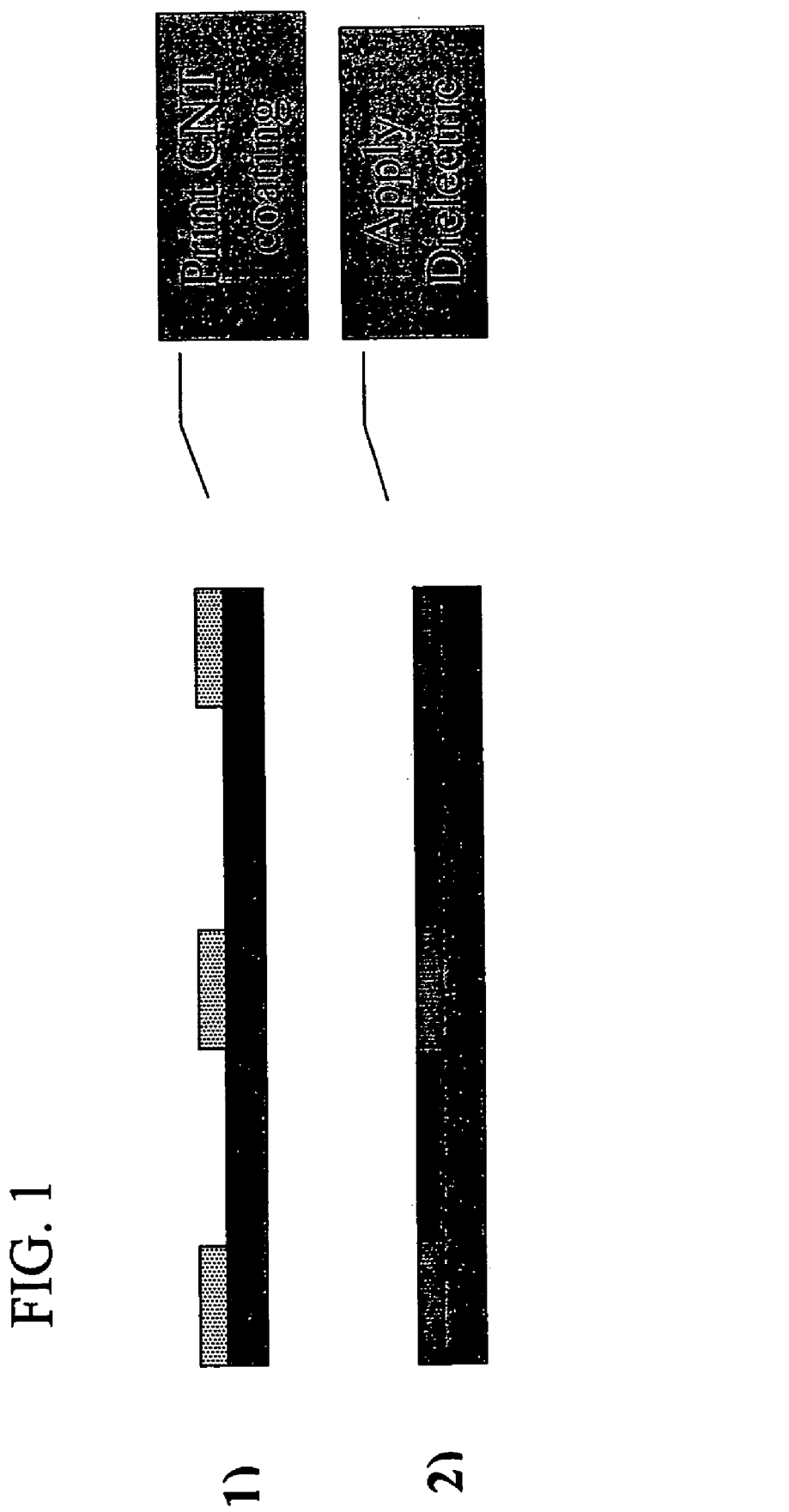
FIG. 1 shows process steps of a patterning method of carbon nanotube film of an embodiment (example 1) of this invention.

As embodied and broadly described herein, this invention is directed to articles and methods for patterning carbon nanotube coatings and, in particular, to carbon nanotube wiring made by the methods.

In this invention, a unique features of the carbon nanotube film forming method described above is used. That is, the consolidated carbon nanotubes dried on the substrate have a remarkably strong adhesion to the surface of the substrate without any other ingredient such as a binder. Accordingly, the device intermediate, i.e., the substrate having the consolidated carbon nanotubes, is compatible with many existing device processing techniques. Yet, the adhesion is weak enough to be broken by fairly moderate disturbance. In addition, the carbon nanotubes consolidated on the substrate have a network structure that has a large amount of open porosity. Accordingly, a material that has a viscosity low enough to penetrate into the open pores may be applied on the substrate so that the open pores of the consolidated carbon nanotubes are filled with the material.

A microscopic observation of the consolidated carbon nanotubes on the substrate, prior to the application of the resin, showed that the network structure is based on a formation of ropes of the carbon nanotubes and the ropes form the frame of the network structure. This structure provides the low electrical resistance and the high light transmittance at the same time since the frame of the ropes can carry the majority of conduction and the relatively large openings between the ropes allow the penetration of the resin applied on the carbon nanotubes.

There are different approaches to forming a patterned carbon nanotube film relying on these features. For example, a carbon nanotube film may first be formed on the entire surface of a substrate. Since the consolidated carbon nanotubes on the substrate can take in various materials as part of the network structure, chemical agents for patterning may be introduced to the entire portion of the consolidated film or a selected portion of the film. For example, a binder dissolved in a solvent may be applied to the consolidated carbon nanotube film according to a predetermined pattern. Application of the binder may be performed by any conventional methods including preferably screen printing, ink jetting and gravure roll printing. After drying out the solvent, the binder remains in the network and reinforces the portion of the carbon nanotube film impregnated with the binder solution. By rinsing the substrate having the carbon nanotubes thereon with water or solvent that does not dissolves the binder, the part of the carbon nanotubes that are not reinforced by the binder easily comes off the substrate whiles the reinforced portion of the carbon nanotube film remains intact. The substrate may be flexible or rigid, and may be made of a transparent material or a light-blocking material. For a transparent electrode application, typically a transparent inorganic glass plate is used as the substrate, although a transparent flexible polymer film may also be used. The substrate may also be a silicon substrate when the carbon nanotube wiring is used as part of integrated circuit. Furthermore, insulating layer may be formed on the carbon nanotube wiring as a protection layer. Additional carbon nanotube wiring may be formed on the insulating layer protecting the first carbon nanotube wiring to form a multi-layered wiring structure.

Rather than applying the binder to the selected portion of the carbon nanotube film, a photoresist may be applied to the entire carbon nanotube film. Application of the photoresist may be performed by any conventional methods including preferably spin coating. Once the photoresist penetrates into the network structure of the consolidated carbon nanotubes, this device intermediate may be compatible with any conventional photolithographic processing step. For example, a predetermined pattern of a reticle is projected onto the carbon nanotube film impregnated with the photoresist.

Depending on the type of the photoresist used, the portion of the carbon nanotube film irradiated by light or the portion of the film not irradiated is removed in the subsequent process. The wiring pattern of the reticle is transferred onto the carbon nanotube film. In comparison to the binder patterning method, this method provides finer patterning of the carbon nanotube film, and may be more compatible with the existing silicon-based device manufacturing methods. Any substrate described herein may be used as the substrate for this manufacturing method. An insulating layer may be formed over the patterned carbon nanotube film, and a multi-layered carbon nanotube wiring may also be formed.

Furthermore, the carbon nanotube film formed on the substrate may not have to be physically patterned at all. That is, the electronic nature of the carbon nanotube film may be manipulated without removing the film physically form the substrate. Single-walled carbon nanotubes (SWNTs) undergo large structural reconstruction when irradiated by a strong light source. Although SWNTs may burn out in air under strong light irradiation, they transform into materials with much higher resistance under a proper irradiation condition. Such features of carbon nanotubes are described, in "Nanotubes in a Flash—Ignition and Reconstruction," P. M. Ajayan et. al, Science 296, 70 (2002). For the light irradiation, conventional photolithographic instruments may be used to project a predetermined pattern onto the carbon nanotube film. When the wiring pattern to be formed is relatively large, the light irradiation may be performed by simply placing a mask on the substrate. When the substrate is transparent, preferably the mask may be placed on the back side of the substrate. The mask may also be directly placed on the carbon nanotube film. The change in the conductivity is not expected to have significant influence on the light transmittance of the carbon nanotube film as well as the network structure of the nanotube ropes. A binder is then applied to the entire carbon nanotube film and penetrates into the network structure to reinforce the structure. An insulating layer may be formed over the carbon nanotube film, and a multi-layered carbon nanotube wiring may also be formed.

A patterned carbon nanotube film may be formed directly on a substrate using application methods of the invention including preferably screen printing, ink jetting and gravure roll printing. However, the carbon nanotube water solution used above to form the carbon nanotube film may not be appropriate for this method since the viscosity of the solution is not high enough to be compatible with these application method. Accordingly, chemical agents may need to be added to the solution to increase viscosity. Alternatively, a mixture of the carbon nanotubes and a binder, such as those described in U.S. Ser. No. 10/105,623, may be used as an ink for these application methods. After a predetermined pattern of the carbon nanotube is formed on the substrate, the chemical agents used for increasing the viscosity may be removed to gain a proper conductivity and light transmittance by drying the substrate or burning the chemical agents in a proper atmosphere. This processing step transforms the carbon nanotubes printed on the substrate into a network structure similar to that created by the application of the carbon nanotube water solution to the substrate. To secure the patterned carbon nanotube film thus formed, a binder may be applied on the entire surface of the substrate. The binder penetrates into the network structure at the portions of the substrate on which the carbon nanotube film is formed, and directly covers the substrate between the carbon nanotube wiring lines. Any substrate may be used as the substrate for this manufacturing method. An insulating layer may be formed over the binder layer, and a multi-layered carbon nanotube wiring may also be formed. This method is effective in reducing the amount of carbon nanotubes used, and provides a planar device intermediate, which may otherwise include the formation of planarization layer for subsequent processing steps.

A continuous carbon nanotube film coated onto a substrate may be patterned by placing a patterned "sticky" surface (roll or plate) in direct contact with the carbon nanotube film. If the sticky substance is patterned in the reverse image of the predetermined wiring pattern, then the portion of the film not used in the wiring will transfer from the film onto the transfer roll or plate. A patterned carbon nanotube film is formed when the carbon nanotube coated substrate is released from the transfer roll or plate.

Furthermore, any two or more of the patterning methods of the carbon nanotubes may be combined to form wiring structures of a device. For example, gate lines and associated gate electrodes of switching transistors of an electroluminescent display device may be formed by the photolithographic process of the photoresist impregnated with the carbon nanotubes. On the other hand, anode electrodes of electroluminescent elements of the display device may be formed by screen printing the high viscosity carbon nanotube solution on a device intermediate that has the gate lines and gate electrode formed therein.

It is preferable that the average outer diameter of the carbon nanotubes of the carbon nanotube film is 3.5 nm or smaller. Carbon nanotubes used in the film forming methods above include straight and bent multi-walled nanotubes (MWNTs), straight and bent double-walled nanotubes (DWNTs), straight and bent single-walled nanotubes (SWNTs) and carbon nanotubes that have been chemically modified to include other compounds and functional groups. SWNTs are preferable because they naturally aggregate to form the ropes of the carbon nanotubes. The concentration of the carbon nanotube by volume in the carbon nanotube film, i.e., how much space is filled by the carbon nanotube, is preferably 5–50%, 5–10%, 10–15%, 15–20%, 20–25%, 25–30%, 30–35%, 35–40%, 40–45%, 45–50%, 10–20%, 5–25%, 5–20%, 10–30%, or 5–30%, but may fall outside this range depending on the application of the carbon nanotube wiring. The aspect ratio of the carbon nanotubes may be between 10 and 2000.

The surface resistance and the volume resistance of the carbon nanotube film may vary depending on the type and the concentration of the carbon nanotube used. The surface resistance of the film may be between $10^2$ and $10^{10}$ ohms/square, and is preferably between $10^2$ and $10^4$ ohms/square, between $10^4$ and $10^6$ ohms/square, between $10^6$ and $10^8$ ohms/square, or between $10^8$ and $10^{10}$ ohms/square. The volume resistance of the film may be between $10^{-2}$ and $10^{10}$ ohms-cm, and is preferably between $10^{-2}$ and $10^0$ ohms-cm, between $10^0$ and $10^2$ ohms-cm, between $10^2$ and $10^4$ ohms-cm, between $10^4$ and $10^6$ ohms-cm, between $10^6$ and $10^8$ ohms-cm, or between $10^8$ and $10^{10}$ ohms-cm. Preferably, the light transmittance of the carbon nanotube is 80% or higher (e.g., 85, 90, 95, 97, 99), and the haze value of the carbon nanotube film is 0.5% (e.g. 0.4, 0.3, 0.2, 0.1, 0.01) or lower. Nonetheless, carbon nanotube films with much low light transmittance or much higher haze value may be used to form the carbon nanotube wiring. The thickness of the carbon nanotube film may be between 0.5 nm and 1 $\mu$m (e.g., 0.8, 1, 2, 3, 5, 10, 25, 50, 100, 150, 500, 750 nm), and is preferably between 1 and 100 nm.

The binder to secure the network structure of the carbon nanotube film and the insulating overcoat may be made of polymeric materials, which may be selected from a wide range of natural or synthetic polymeric resins. The particular polymer may be chosen in accordance with the strength, structure, or design needs of a desired application, such as thermoplastics, thermosetting polymers, elastomers and combinations thereof. Specifically, they may be polyethylene, polypropylene, polyvinyl chloride, styrenic, polyurethane, polyimide, polycarbonate, polyethylene terephthalate, cellulose, gelatin, chitin, polypeptides, polysaccharides, polynucleotides and mixtures thereof. Furthermore, ceramic hybrid polymers, phosphine oxides and chalcogenides may be used.

Conducting fillers may be added into the carbon nanotubes. The fillers may be conductive organic materials, inorganic materials or combinations or mixtures of such materials. The conductive organic materials may be buckeyballs, carbon black, fullerenes and combinations and mixtures thereof. Conductive inorganic materials may be aluminum, antimony, beryllium, cadmium, chromium, cobalt, copper, doped metal oxides, iron, gold, lead, manganese, magnesium, mercury, metal oxides, nickel, platinum, silver, steel, titanium, zinc, or combinations or mixtures thereof. Preferred conductive materials include tin-indium mixed oxide, antimony-tin mixed oxide, fluorine-doped tin oxide, aluminum-doped zinc oxide and combinations and mixtures thereof.

Vacuum annealing of the carbon nanotube film prior to the binder impregnation may further reduce the resistance of the carbon nanotube film. This is promoted by a fusion of the carbon nanotubes at the junction of the carbon nanotube ropes. Since the rope itself has an almost metal-like conductivity and the total conductivity of the film is likely determined by the morphologies of the rope junctions, any treatment to thicken the junctions increases the conductivity of the carbon nanotube film. When nanometer-size particles of metals are mixed into the carbon nanotube film, those nano particles may migrate into the junctions upon annealing. This will also result in reducing the resistance.

Larger metal particles may be introduced into the carbon nanotube film in a large amount. Such a composite film may also be considered as adding the carbon nanotubes into the dispersion of large conductive metal particles. When metals such as silver, gold, copper, blends, aluminum, magnesium and their alloys are used, this combination achieves improvement in conductivity over the pure carbon nanotube film by about six orders of magnitude or larger. Yet, the amount of the metal fillers of this composite film is much less than the amount required to achieve the percolation threshold relying on only the metal fillers. Accordingly, the composite carbon nanotube film may maintain light transmittance suitable for transparent electrode applications. As an alternative, carbon black particles may replace the metal particles in the composite film. This combination may not achieve high conductivity, but manufacturing cost of the carbon nanotube film may be reduced because of the reduced amount of the carbon nanotubes used in the film.

Wiring made from these patterned nanocomposite coatings may be used as for example transparent electrodes and circuits for flat panel displays, photovoltaics, touch screens, electroluminescent lamps, and EMI shielding.

The following examples illustrate embodiments of the invention, but should not be viewed as limiting the scope of the invention.

EXAMPLES

Four examples of formation of carbon nanotube wiring are described below with reference to FIGS. 1–4, respectively. The following examples are only for illustrative purposes and do not limit the general descriptions on the patterned carbon nanotube film formation described above.

Example 1

First, as purchased SWNTs are purified by process steps including acid reflex, water rinsing, centrifuge and microfiltration. Then, the purified SWNTs are mixed into a solution of isopropyl alcohol (IPA) and water to form a carbon nanotube coating solution. The SWNT solids content is in the range of 10 to 100 ppm by weight. The weight ratio of IPA to water is in the range of 1:3 to 3:1, depending on the drying rate desired for the coating. Once a reasonably stable dispersion has been achieved, the viscosity of the SWNT dispersion is increased by adding a sufficient amount of a polyacrylic acid, a viscosity modifying agent (Acrysol ASE 75, available from Rohm & Haas), to provide a coating composition having a viscosity suitable for gravure coating, (e.g., approximately 1000 cP). The carbon nanotube coating solution is printed onto a clear plastic film (e.g., polyethersulfone) using a patterned gravure roll. The IPA/water and viscosity modifier are then removed by heating, leaving behind a film of consolidated carbon nanotubes that is patterned. A dielectric binder coating (e.g., acrylic resin dissolved in ethyl acetate) is then applied using an atomized spraying technique. The binder coating permeates the carbon nanotube film, enhancing adhesion and mechanical properties. The resulting patterned electrode or circuit exhibits good transparency and low electrical resistance. This method is schematically shown in FIG. 1.

Example 2

Figure 2:
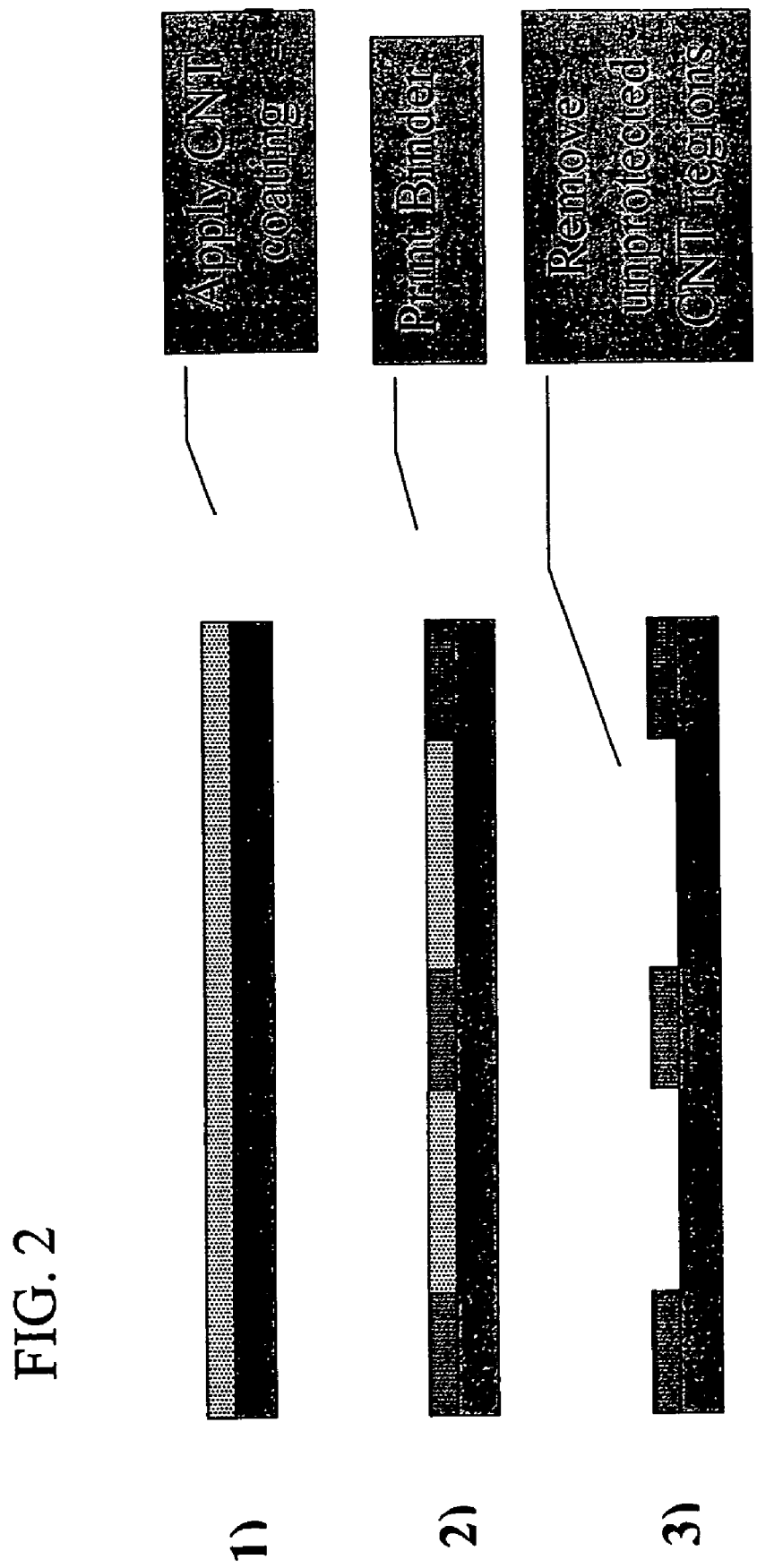
FIG. 2 shows process steps of a patterning method of carbon nanotube film of another embodiment (example 2) of this invention.

First, as purchased SWNTs are purified by process steps including acid reflex, water rinsing, centrifuge and microfiltration. Then, the purified SWNTs are mixed into a solution of isopropyl alcohol (IPA) and water to form a carbon nanotube coating solution. The SWNT solids content is in the range of 10 to 100 ppm by weight. The weight ratio of IPA to water is in the range of 1:3 to 3:1, depending on the drying rate desired for the coating. The SWNT coating is applied to a clear plastic film (e.g., polyester film such as PET or PEN film from Dupont Teijin Films) using an atomized spraying technique. The substrate is heated to 60° C. to increase drying rate of the IPA/water. A sufficient thickness of the consolidated carbon nanotubes is applied to achieve the desired electrical resistance (e.g., 500 ohms/square). Then, a binder coating such as acrylic resin dissolved in ethyl acetate is printed using a screen printing technique. The binder coating permeates selected regions of the carbon nanotube film, enhancing adhesion and mechanical properties. The solvent is removed by heating. Then, the unprotected carbon nanotube regions are removed by a spray washing technique using a mixture of water and Triton X-100 surfactant. The resulting patterned electrode or circuit exhibits good transparency and low electrical resistance. This method is schematically shown in FIG. 2.

Example 3

Figure 3:
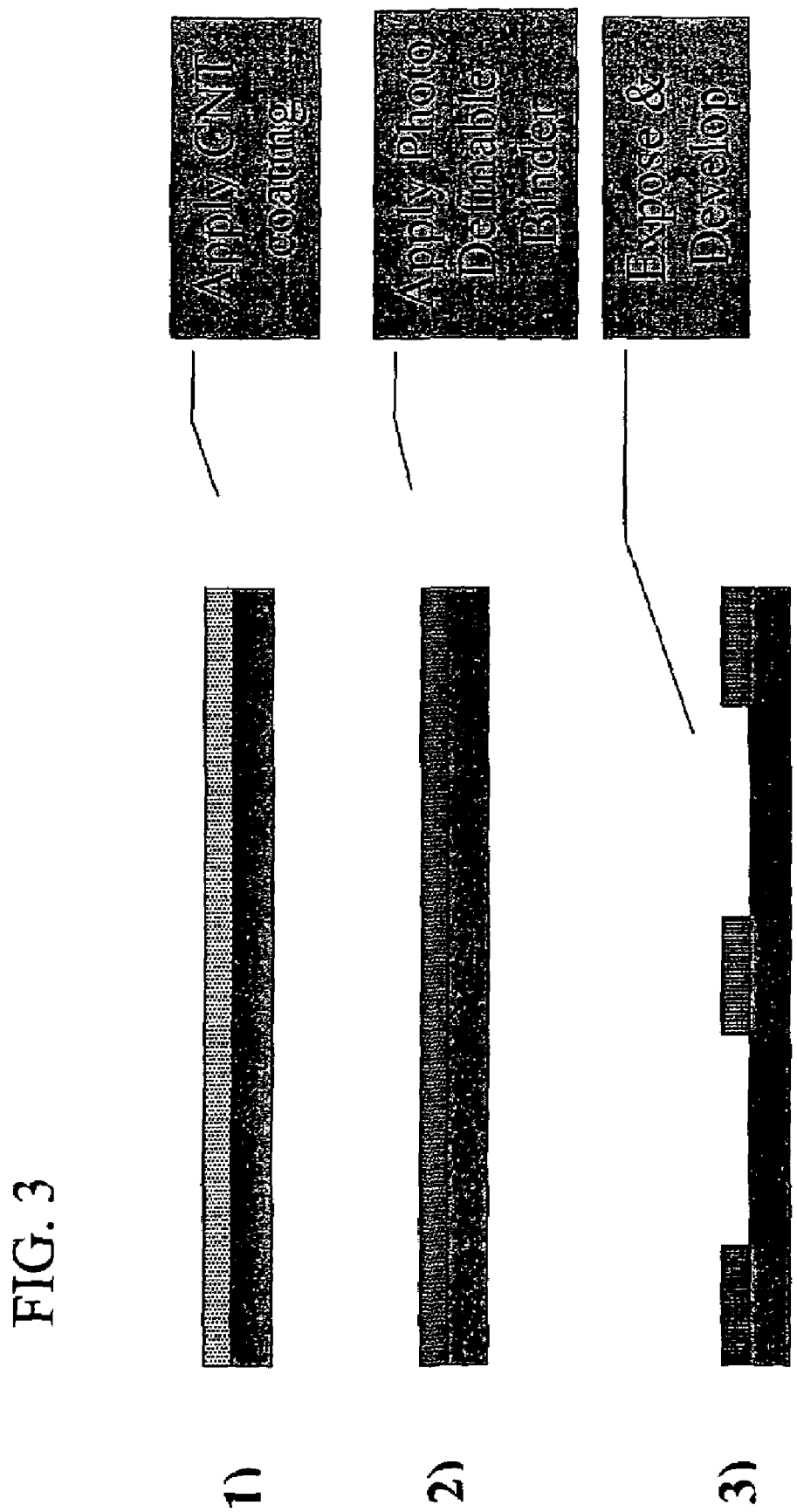
FIG. 3 shows process steps of a patterning method of carbon nanotube film of another embodiment (example 3) of this invention.
Figure 4:
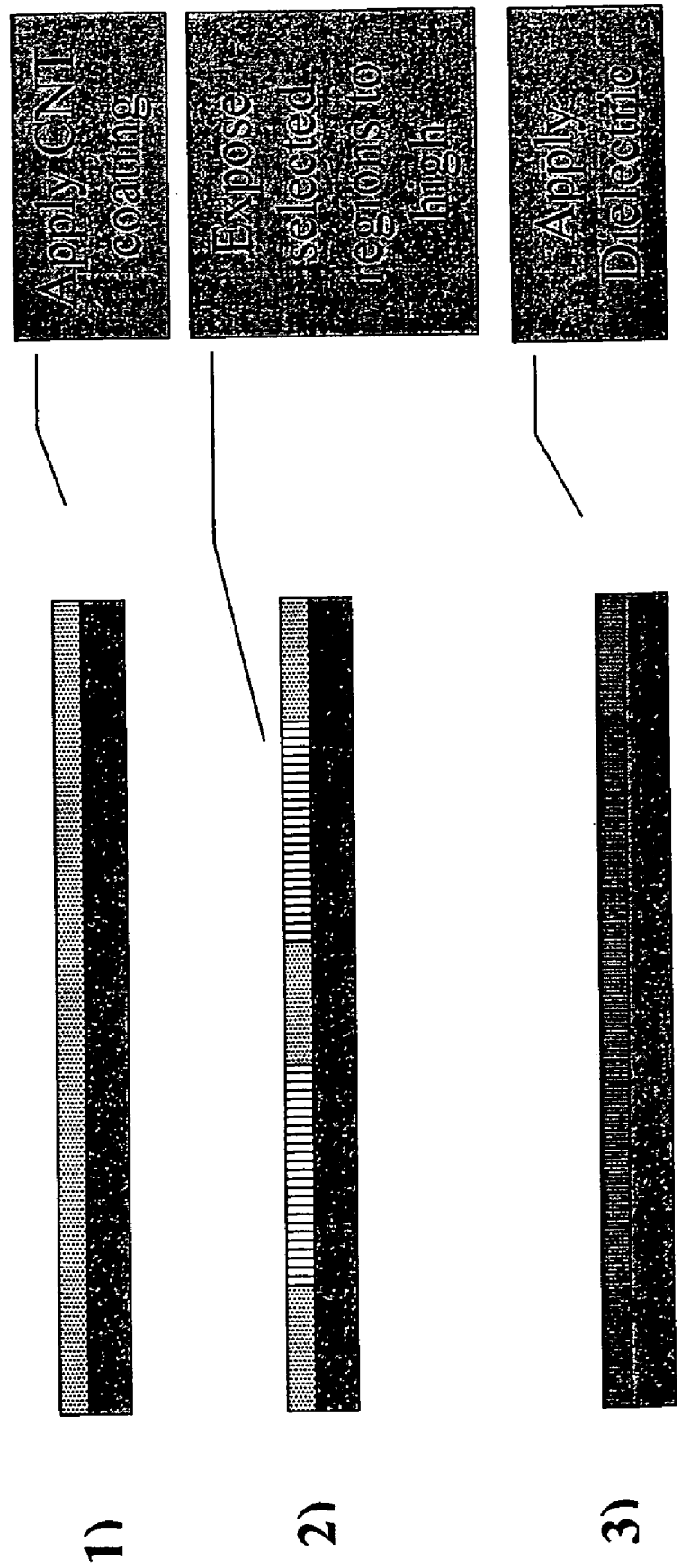
FIG. 4 shows process steps of a patterning method of carbon nanotube film of another embodiment (example 4) of this invention.

First, as purchased SWNTs are purified by process steps including acid reflex, water rinsing, centrifuge and microfiltration. Then, the purified SWNTs are mixed into a solution of isopropyl alcohol (IPA) and water to form a carbon nanotube coating solution. The SWNT solids content is in the range of 10 to 100 ppm by weight. The weight ratio of IPA to water is in the range of 1:3 to 3:1, depending on the drying rate desired for the coating. The SWNT coating is applied to a glass substrate using an atomized spraying technique. The substrate is heated to 60° C. to increase drying rate of the IPA/water. A sufficient thickness of consolidated carbon nanotubes is applied to achieve the desired electrical resistance (e.g., 500 ohms/square). Then, a photo definable polyimide binder such as HD-4000 Series from HD Microsystems is applied to the consolidated carbon nanotube film using a Meyer rod coating technique. The photoresist permeates the carbon nanotube film. A predetermined wiring pattern is projected onto the photoresist impregnated with carbon nanotubes using standard photolithographic techniques. Selected regions of the carbon nanotube film are removed when the uncured polyimide regions are rinsed away by the developer. The resulting patterned electrode or circuit exhibits good transparency and low electrical resistance. This method is schematically shown in FIG. 3.

Example 4

The coating solution is prepared as in Example 3 is applied to a glass substrate using an atomized spraying technique. The substrate is heated to 60° C. to increase drying rate of the IPA/water. A sufficient thickness of the consolidated carbon nanotubes is applied to achieve the desired electrical resistance (e.g., 500 ohms/square). A high intensity mercury light source is projected through a mask onto the carbon nanotube coated glass. This exposure results in higher electrical resistance for selected regions of the carbon nanotube film, without significantly reducing the optical transparency. A dielectric binder coating (e.g., acrylic resin dissolved in ethyl acetate) is then applied using an atomized spraying technique. The binder coating permeates the carbon nanotubes, enhancing adhesion and mechanical properties. The resulting patterned electrode or circuit exhibits good transparency and low electrical resistance. This method is schematically shown in FIG. 3.

In Examples 2 and 3, the carbon nanotube films do not have to be completely removed. As long as neighboring wiring elements are not electrically connected, a certain amount of the nanotubes may remain on the substrate.

Other embodiments and uses of the invention will be apparent to those skilled in the art from consideration of the specification and practice of the invention disclosed herein. All references cited herein, including all publication, U.S. patents and patent applications including the priority documents, are specifically and entirely incorporated by reference. It is intended that the specification and examples be considered exemplary only with the true scope and spirit of the invention indicated by the following claims.

What is claimed is:

1. A method for patterning a carbon nanotube coating, comprising:
    providing a solution of carbon nanotubes;
    applying the solution to a substrate to form a film of consolidated carbon nanotubes on the substrate;
    impregnating the carbon nanotube film selectively with a binder; and
    removing at least a part of the carbon nanotube film that is not impregnated with the binder from the substrate.

2. The method for patterning the carbon nanotube coating of claim 1, wherein providing the solution of carbon nanotubes comprises purifying the carbon nanotubes.

3. The method for patterning the carbon nanotube coating of claim 1, wherein the providing of the solution of carbon nanotubes comprises dispersing the carbon nanotubes in a solution of water and an alcohol.

4. The method for patterning the carbon nanotube coating of claim 1, wherein applying of the solution comprises spraying the solution with an atomizer.

5. The method for patterning the carbon nanotube coating of claim 1, wherein impregnating the carbon nanotube film comprises printing the binder on the carbon nanotube film with a predetermined pattern.

6. The method for patterning the carbon nanotube coating of claim 1, wherein removing the carbon nanotubes comprising spray washing the carbon nanotube film with a mixture of water and a surfactant.

7. The method for patterning the carbon nanotube coating of claim 1, wherein impregnating the carbon nanotube film comprises spraying the binder.

8. The method for patterning the carbon nanotube coating of claim 1, wherein removing the carbon nanotubes comprising transferring a part of the carbon nanotube film from the substrate to a sticky surface.

9. A method for patterning a carbon nanotube coating, comprising:
    providing a solution of carbon nanotubes;
    applying the solution to a substrate to form a film of consolidated carbon nanotubes on the substrate;
    impregnating the carbon nanotube film with a photoresist;
    projecting a predetermined pattern onto the carbon nanotube film impregnated with the photoresist to secure a part of the carbon nanotube film; and
    removing at least a part of the carbon nanotube film that is not secured by the projection from the substrate.

10. The method for patterning a carbon nanotube coating of claim 9, wherein providing the solution of carbon nanotubes comprises purifying the carbon nanotubes.

11. The method for patterning a carbon nanotube coating of claim 9, wherein providing the solution of carbon nanotubes comprises dispersing the carbon nanotubes in a solution of water and an alcohol.

12. The method for patterning a carbon nanotube coating of claim 9, wherein applying the solution comprises spraying the solution with an atomizer.

13. The method for patterning a carbon nanotube coating of claim 9, wherein impregnating the carbon nanotube film comprises rod coating the photoresist on the substrate or spin coating the photoresist on the substrate.

14. The method for patterning a carbon nanotube coating of claim 9, wherein removing the carbon nanotube film comprises removing the unsecured part of the carbon nanotube film with a developer solution of the photoresist.

15. A method for patterning a carbon nanotube coating, comprising:
    providing a solution of carbon nanotubes;
    applying the solution to a substrate to form a film of consolidated carbon nanotubes on the substrate;
    exposing the carbon nanotube film to a light source through a mask; and
    impregnating the exposed carbon nanotube film with a binder.

16. The method for patterning a carbon nanotube coating of claim 15, wherein providing the solution of carbon nanotubes comprises purifying.

17. The method for patterning a carbon nanotube coating of claim 15, wherein providing the solution of carbon nanotubes comprises dispersing the carbon nanotubes in a solution of water and an alcohol.

18. The method for patterning a carbon nanotube coating of claim 15, wherein applying the solution comprises spraying the solution with an atomizer.

19. The method for patterning a carbon nanotube coating of claim 15, wherein impregnating the carbon nanotube film comprises spraying the binder.

20. A method for patterning a carbon nanotube coating, comprising:
   providing a coating mixture comprising carbon nanotubes and a solvent;
   applying the coating mixture on a substrate to form a predetermined pattern;
   removing the solvent from the coating mixture printed on the substrate to leave a film of consolidated carbon nanotubes on the substrate; and
   impregnating the carbon nanotube film with a binder.

21. The method for patterning a carbon nanotube coating of claim 20, wherein providing the coating mixture comprises purifying.

22. The method for patterning a carbon nanotube coating of claim 20, wherein providing the coating mixture comprises dispersing the carbon nanotubes in a solution of water.

23. The method for patterning a carbon nanotube coating of claim 20, wherein applying the coating mixture comprises screen printing, jet printing or gravure roll printing.

24. The method for patterning a carbon nanotube coating of claim 20, wherein removing the solvent comprises heating the substrate.

25. The method for patterning a carbon nanotube coating of claim 20, wherein impregnating the carbon nanotube film comprises spraying the binder.

26. The method for patterning a carbon nanotube coating of claim 20, wherein providing the coating mixture comprises adding a viscosity modifying agent.

27. A method for patterning a carbon nanotube coating, comprising:
   providing a solution of carbon nanotubes;
   applying the solution to a substrate to form a film of consolidated carbon nanotubes on the substrate;
   removing at least a part of the carbon nanotube film from the substrate,
   impregnating the carbon nanotube film remaining on the substrate with a binder.

28. The method for patterning the carbon nanotube coating of claim 27, wherein providing the solution of carbon nanotubes comprises purifying the carbon nanotubes.

29. The method for patterning the carbon nanotube coating of claim 27, wherein the providing of the solution of carbon nanotubes comprises dispersing the carbon nanotubes in a solution of water and an alcohol.

30. The method for patterning the carbon nanotube coating of claim 27, wherein applying of the solution comprises spraying the solution with an atomizer.

* * * * *